(12) United States Patent
Granig et al.

(10) Patent No.: US 10,677,859 B2
(45) Date of Patent: *Jun. 9, 2020

(54) MINIMUM MAGNETIC FIELD DETECTION SYSTEMS AND METHODS IN MAGNETORESISTIVE SENSORS FOR MAGNETIC FIELD STRENGTH AND MAGNETIC FIELD ANGLE DETECTION

(71) Applicant: Infineon Technologies AG, Neubiberg (DE)

(72) Inventors: Wolfgang Granig, Seeboden (AT); Juergen Zimmer, Neubiberg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 15/956,247

(22) Filed: Apr. 18, 2018

(65) Prior Publication Data
US 2018/0299518 A1 Oct. 18, 2018

Related U.S. Application Data

(60) Division of application No. 15/078,429, filed on Mar. 23, 2016, now Pat. No. 9,952,292, which is a
(Continued)

(51) Int. Cl.
*G01R 33/09* (2006.01)
*G01R 33/00* (2006.01)

(52) U.S. Cl.
CPC ....... *G01R 33/091* (2013.01); *G01R 33/0047* (2013.01); *G01R 33/09* (2013.01); *G01R 33/093* (2013.01)

(58) Field of Classification Search
CPC combination set(s) only.
See application file for complete search history.

(56) References Cited

U.S. PATENT DOCUMENTS

| 5,561,368 A | 10/1996 | Dovek et al. |
| 5,694,039 A | 12/1997 | Alfors |
| | (Continued) | |

OTHER PUBLICATIONS

Application and Filing Receipt for U.S. Appl. No. 14/083,647, filed Nov. 19, 2013, inventor Ausserlechner.
(Continued)

*Primary Examiner* — Jay Patidar
(74) *Attorney, Agent, or Firm* — Schiff Hardin LLP

(57) ABSTRACT

Embodiments relate to magnetoresistive sensors suitable for both angle and field strength sensing. In an embodiment, a sensor comprises two different magnetoresistive (xMR) sensor components for sensing two different aspects or characteristics of a magnetic field. In an embodiment, the first xMR sensor component is configured for magnetic field angle or rotation sensing, while the second xMR sensor component is configured for magnetic field strength sensing. In an embodiment, the second xMR sensor component is configured for magnetic field strength sensing in two dimensions. The second xMR sensor therefore can determine, in embodiment, whether the field sensed with respect to angle or rotation by the first xMR sensor component is of sufficient strength or meets a minimum magnitude threshold. If the minimum threshold is not met, an alarm or alert can be provided.

21 Claims, 5 Drawing Sheets

Related U.S. Application Data continuation of application No. 13/493,412, filed on Jun. 11, 2012, now Pat. No. 9,316,706.

(56) References Cited

U.S. PATENT DOCUMENTS

| | | | |
|---|---|---|---|
| 8,305,073 B2 | 11/2012 | Kather | |
| 8,378,664 B2 | 2/2013 | Hinz | |
| 8,884,616 B2 | 11/2014 | Zimmer et al. | |
| 2002/0149358 A1 | 10/2002 | Doescher | |
| 2003/0090265 A1* | 5/2003 | Wan | G01D 5/14 324/207.25 |
| 2007/0044548 A1 | 3/2007 | Ishizuka et al. | |
| 2007/0200564 A1* | 8/2007 | Motz | G01R 33/09 324/247 |
| 2008/0174301 A1 | 7/2008 | Mattson | |
| 2009/0256552 A1* | 10/2009 | Guo | G01B 7/30 324/207.21 |
| 2010/0060263 A1 | 3/2010 | Granig et al. | |
| 2010/0072988 A1 | 3/2010 | Hammerschmidt et al. | |
| 2010/0188078 A1 | 7/2010 | Foletto et al. | |
| 2011/0187350 A1 | 8/2011 | Ausserlechner et al. | |
| 2013/0335072 A1 | 12/2013 | Malzfeldt | |
| 2015/0022186 A1 | 1/2015 | Ausserlechner | |
| 2015/0022192 A1 | 1/2015 | Ausserlechner | |
| 2015/0068341 A1 | 3/2015 | Andreasen et al. | |
| 2016/0054351 A1 | 2/2016 | Dunbar et al. | |

OTHER PUBLICATIONS

Application and Filing Receipt for U.S. Appl. No. 14/174,580, filed Feb. 6, 2014, inventro Ausserlechner.

Application and Filing Receipt for U.S. Appl. No. 14/535,537, filed Nov. 7, 2014, inventors Zimmer, et al.

Infineon Technologies AG, Angle Sensor: GMR-Based Angular Sensor for Rotor-Pasition Sensign TLE5012, Ò 2011, Edition 2010-11, 64 pages.

Application and File History for U.S. Appl. No. 13/944,410, filed Jul. 17, 2013, inventor Ausserlechner.

* cited by examiner

MINIMUM MAGNETIC FIELD DETECTION SYSTEMS AND METHODS IN MAGNETORESISTIVE SENSORS FOR MAGNETIC FIELD STRENGTH AND MAGNETIC FIELD ANGLE DETECTION

CROSS REFERENCE TO RELATED APPLICATIONS

This is a Divisional Application of U.S. patent application Ser. No. 15/078,429, filed Mar. 23, 2016, now U.S. Pat. No. 9,952,292, issued on Apr. 24, 2018, which is a Continuation application of U.S. patent application Ser. No. 13/483,412, filed Jun. 11, 2012, now U.S. Pat. No. 9,316,706, issued on Apr. 19, 2016, each of which is incorporated herein by reference in its entirety.

TECHNICAL FIELD

The invention relates generally to magnetoresistive (xMR) sensors and more particularly to detecting a minimum magnetic field amplitude while also sensing magnetic field angle or rotation in xMR sensors.

BACKGROUND

Magnetoresistive sensors, such as giant magnetoresitive (GMR), are often used in angle sensing applications. A drawback of these sensors, however, is that while they can detect the direction of a magnetic field they are not sensitive to the amplitude of the magnetic field. In some applications this is of no consequence, but in others, such as automotive, relevant safety standards require a minimum magnetic field to ensure angle accuracy. This can be important because angle error generally increases at low magnetic fields, as depicted in FIG. 1. In FIG. 1, it can be seen that if the magnetic field strength falls below about 20 mT, the angle error increases significantly. Therefore, a reduction or loss of magnetic field during operation must be detected in certain safety-related applications.

Conventional approaches include use of vertical Hall devices for angle sensing instead of GMR devices, or combining a GMR sensor for direction sensing with a Hall sensor for amplitude sensing. Vertical Hall devices, however, are not as sensitive as GMR devices, while the addition of a lateral Hall device requires additional space that may be at a premium or not available at all.

Therefore, there is a need for improved xMR angle sensors.

SUMMARY

Embodiments relate to magnetoresistive sensors. In an embodiment, a magnetoresistive (xMR) sensor comprises xMR magnetic field angle sensing circuitry; and xMR magnetic field magnitude sensing circuitry arranged in a sensor package with the xMR magnetic field angle sensing circuitry.

In an embodiment, a method comprises providing a first magnetoresistive (xMR) sensor in a sensor package; providing a second xMR sensor in the sensor package; sensing at least one characteristic of a magnetic field by the first xMR sensor; and determining whether a magnitude of the sensed magnetic field meets a minimum magnitude threshold by sensing the magnitude of the magnetic field by the second xMR sensor.

In an embodiment, magnetoresistive (xMR) sensor comprises xMR magnetic field angle sensing circuitry formed on a substrate; and xMR magnetic field magnitude sensing circuitry formed on the substrate.

In an embodiment, a magnetic field sensing system comprises an under-field detector configured to determine whether a magnetic field sensed by the magnetic field sensing system operates in a first state and to output an alarm signal based on the determining of the operation in the first state, wherein the first state corresponds to a state in which an external magnetic field to be sensed by the magnetic field sensing system is below a minimum threshold or is absent missing, wherein the under-field detector comprises a magnetoresistive (xMR) sensor arrangement, and wherein the alarm signal is based on a combination of signals tapped from the xMR sensor arrangement.

BRIEF DESCRIPTION OF THE DRAWINGS

The invention may be more completely understood in consideration of the following detailed description of various embodiments of the invention in connection with the accompanying drawings, in which.

Figure 1:
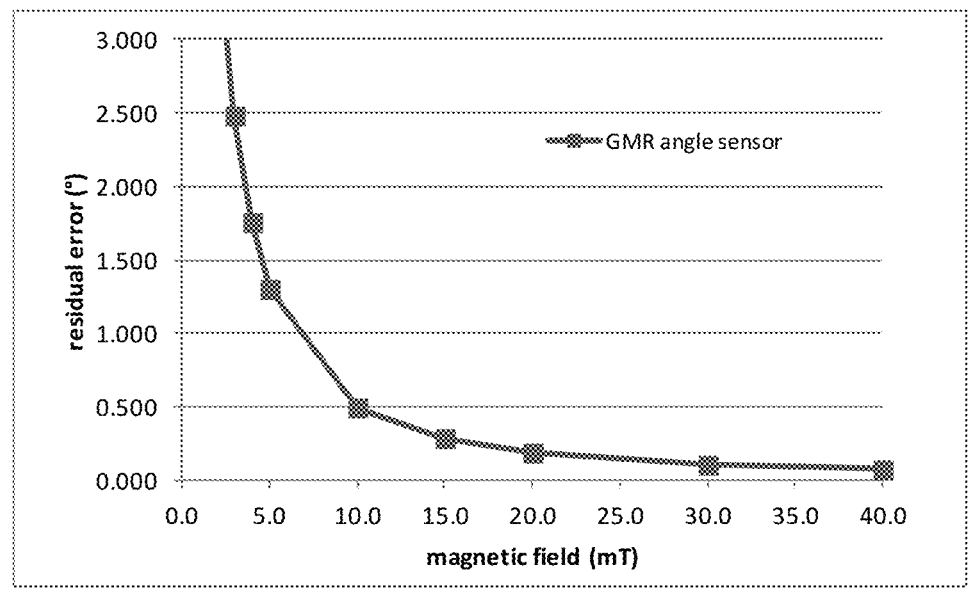
FIG. 1 is a plot of residual error versus magnetic field according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to magnetoresistive sensors suitable for both angle and field strength sensing. In an embodiment, a sensor comprises two different magnetoresistive (xMR) sensor components for sensing two different aspects or characteristics of a magnetic field. In an embodiment, the first xMR sensor component is configured for magnetic field angle or rotation sensing, while the second xMR sensor component is configured for magnetic field strength sensing. In an embodiment, the second xMR sensor component is configured for magnetic field strength sensing in two dimensions. The second xMR sensor therefore can determine, in embodiment, whether the field sensed with respect to angle or rotation by the first xMR sensor component is of sufficient strength or meets a minimum magnitude threshold. If the minimum threshold is not met, an alarm or alert can be provided. An advantage of embodiments, in addition to the ability to sense field strength while also sensing angle or rotation, is that the two xMR sensor components can be processed in the same way, with the same materials and same stacks for both angle and field strength sensing. In an embodiment, the magnetoresistive sensor components comprise giant magnetoresistive (GMR) sensor components, though other technologies can be used in various embodiments, including anisotropic magnetoresistive (AMR) elements, tunneling magnetoresistive (TMR) elements, and others.

Figure 2:
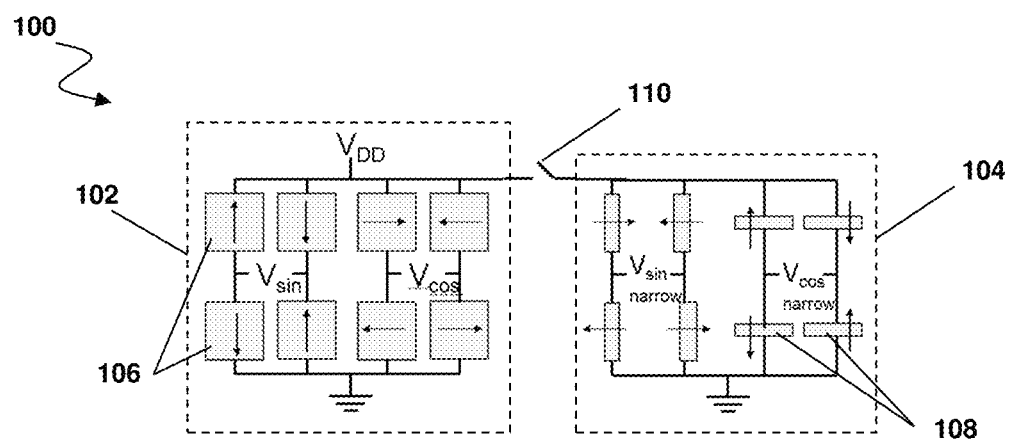
FIG. 2 is a magnetoresistive (xMR) sensor circuit diagram according to an embodiment.

Referring to FIG. 2, a combined angle and field strength sensor 100 is depicted. Sensor 100 comprises xMR angle sensing circuitry 102 and two-dimensional xMR field strength sensing circuitry 104. In an embodiment, GMR circuitry is used and will be referred to herein for example only, with other magnetoresistive technologies can be used in other embodiments. It is therefore intended that embodiments are not limited to GMR elements, such that the term GMR can be generally interchangeably used for other suitable technologies, such as AMR or TMR, unless specifically noted. For example, an embodiment comprising a GMR resistor could instead comprise a TMR element or AMR element or some other suitable technology.

Each of circuitries 102 and 104 comprise a bridge configuration of GMR resistors 106 and 108, respectively, for which the programmed hard magnetization field direction is indicated in FIG. 2 by an arrow on each resistor. In an embodiment, circuitries 102 and 104 are coupled by a switch 110 such that circuitry 104 can be coupled or uncoupled. In embodiments, circuitries 102 and 104 are formed side by side on the same die or substrate, advantageously as part of the same production process, generally requiring only a layout change from circuitry 102 to circuitry 104.

In embodiments, GMR resistors 106 and 108 of circuitries 102 and 104 are narrowly shaped so as to generate a predefined reference magnetization axis for the sensor (free) layer by the shape anisotropy effect. The shape anisotropy effect is the result of the demagnetization field that is established at the edges of magnetic structures. As a result of specific shapes, such as narrow strips, there are preferred axes of magnetization, for example, along the length of each strip. This can also be referred to as the "easy axis." Consequently, the free layer magnetization for each GMR resistor 108 of circuitry 104 depends not only on the angle of the external magnetic field but also on the strength of the external magnetic field.

In embodiments, narrowly shaped GMR resistors 106 and 108 can be formed by narrowly shaped GMR resistor strips. For GMR resistor strips, the shape anisotropy axis is, for example, determined by the length direction of the strips. The narrowly shaped GMR resistors of circuitry 104 are arranged in two Wheatstone bridges. In circuitry 104, GMR resistors 108 of one bridge each have an orientation of the shape anisotropy axis different from the orientation of the shape anisotropy of GMR resistors 108 of the other bridge. In embodiments, each of GMR resistors 108 of one bridge have substantially the same shape anisotropy axis orientation, however GMR resistors 108 belonging to different bridges have different orientations of the shape anisotropy axis. In embodiments, the orientation of the anisotropy axis of GMR resistors 108 of the first bridge and the orientation of the anisotropy axis of GMR resistors 108 of the second bridge are substantially perpendicular to each other. With the configuration of the hard magnetization perpendicular to the shape anisotropy axis, GMR resistors 108 are predominantly sensitive to magnetic field components perpendicular to their shape anisotropy axis orientation. In such a configuration, GMR resistors 108 of the first and second bridges are capable of detecting the in-plane magnetic field components along the x- and y-orientation. The bridge of circuitry 104 shown on the left in FIG. 2 is capable of detecting the sine component of an external magnetic field, and the bridge of circuitry 104 shown on the right in FIG. 2 is capable of detecting the cosine component of the external magnetic field. Upon a rotating magnetic field the outputs of the first and second bridges are phase shifted by approximately 90 degrees.

As will be explained later in more detail, signals tapped from the circuitry 104 can be used in embodiments to determine a situation in which the absolute value or magnitude of the magnetic field vector, for example the absolute value of a magnetic field vector caused by a rotating magnetic field and detected by circuitry 102, falls below a minimum threshold in order to provide an alarm signal. This allows establishing a low-magnetic-alarm or a missing-field-alarm in xMR technology which can provide a safe operation of the overall sensor system including circuitry 102. For example, in one embodiment circuitry 102 can be used by the user to sense an angle of a rotating magnetic field, and circuitry 104 can be used to determine when sensing circuitry 102 is subjected to a situation of a low-magnetic field or a missing magnetic field.

In the embodiment depicted, the Wheatstone bridges of circuitries 102 and 104 are full bridges but also half bridges might be used in other embodiments.

In the embodiment of FIG. 2, each branch of each bridge of circuitry 104 comprises at least one GMR resistor 108 with a hard magnetization in a first direction and a second direction. For the GMR resistors, the hard magnetization can be the reference layer of the spin valve. Also for TMR resistors, the hard magnetization can be the reference layer of the spin valve. In other embodiments, using AMR resistors, the hard magnetization can be a bias magnetic field biasing the AMR resistors. As shown in FIG. 2, the first and second directions of the hard magnetization can be perpendicular. The two bridges of circuitry 104 can have a similar configuration but with different orientation of the shape anisotropy axis of the GMR resistors. While the orientations of the shape anisotropy axes are different, the shape anisotropy can be the same for each of the GMR resistors of the two bridges of circuitry 104. Therefore, the two bridges of circuitry 104 can include the same shape and configuration of GMR resistors but with the GMR resistors of the first bridge being rotated by 90 degree such that the shape anisotropy of the GMR resistors of the two bridges are perpendicular to each other. Additionally, while this embodiment shows two bridges for circuitry 104, other embodiments can include more than two bridges.

Figure 3:
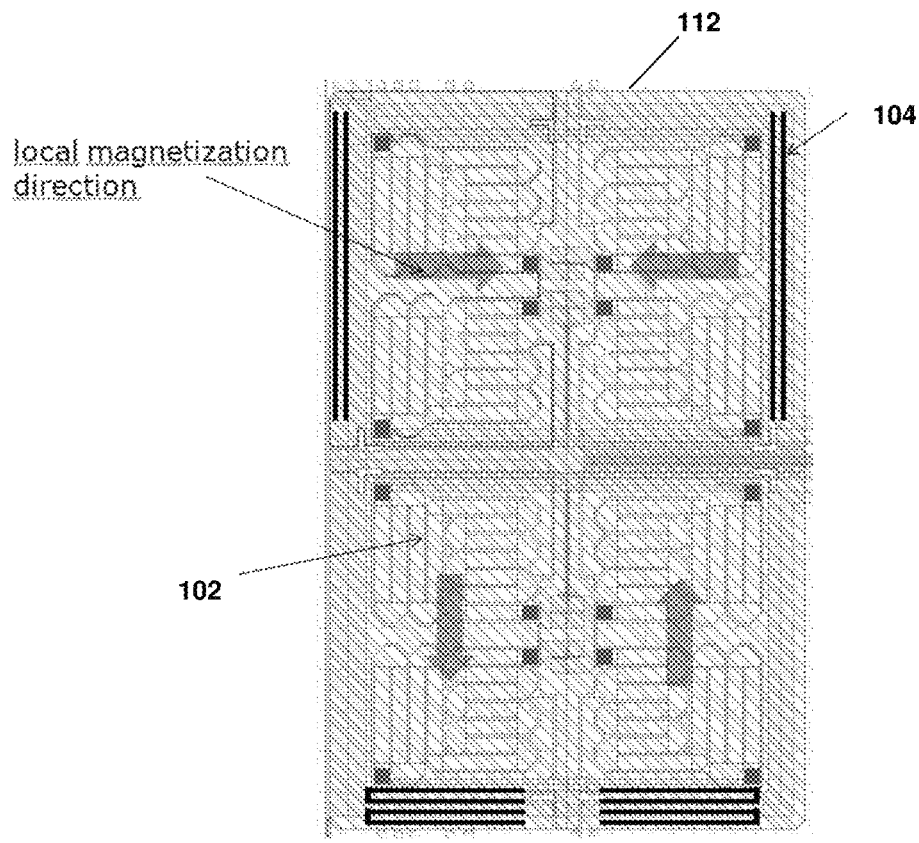
FIG. 3 is a depiction of an xMR sensor in a sensor package according to an embodiment.

Furthermore, the two bridges of circuitry 102 and the two bridges of circuitry 104 can have substantially the same bridge configurations except that the GMR resistors of circuitry 104 have a shape anisotropy substantially higher than the shape anisotropy of the GMR resistors of the circuitry 102. FIG. 3 depicts an example embodiment of positioning sensor 100 with the additional circuitry 104 in an exemplary existing angle sensor package 112. In embodiments, GMR resistors 108 of xMR element 104 are about 0.2 micrometers (μm) to about 2 μm wide, about 50 μm to about 500 μm long and have a resistance of about 1 kΩ to about 10 kΩ. In embodiments, the aspect ratio (length/width) can be between about 4 and about 400. Laser programming can be used to define the hard magnetization direction, and in embodiments the same laser magnetization illumination window can be used to program the hard magnetization of the GMR resistors of both the angle and field strength xMR elements 102 and 104.

In operation, angle sensing circuitry 102 is sensitive to a magnetic field direction while field strength sensing circuitry 104 is sensitive to the magnetic field amplitude along an in-plane axis. Circuit 102 acts as angle sensing circuitry in view of the GMR resistors 108 being provided with a shape anisotropy substantially higher than the shape anisotropy of the GMR resistors 106 of the circuitry 102. Circuitry 104 acts as field strength sensing circuitry in view of the GMR circuitry 104 being generally sensitive to lower magnetic fields and in fact can go into saturation at higher fields, while circuitry 102 generally is sensitive to relatively higher magnetic fields, in accordance with the principles of FIG. 1. Moreover, in view of the shape anisotropic effect, circuitry 104 generally is not accurate with respect to angle sensing but rather can be used with respect to magnetic field strength level such that angles sensed by circuitry 102 can be deemed sufficiently accurate.

There are however, at least two approaches to utilizing sensor 100: circuitry 104 can estimate the magnetic field strength, or circuitry 104 can detect the presence or absence of a minimally acceptable magnetic field strength. Each will be discussed below.

Figure 4A:
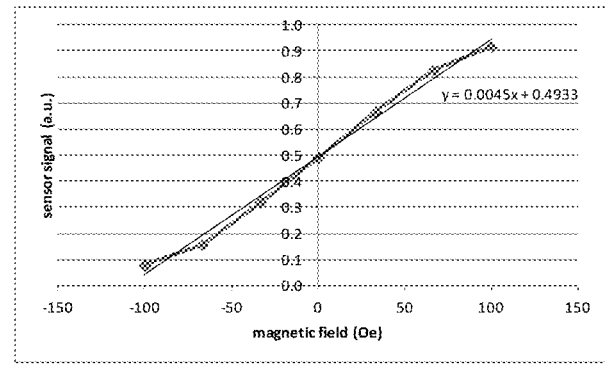
FIG. 4A is a plot of the minor loop of a narrow xMR stripe according to an embodiment.
Figure 4B:
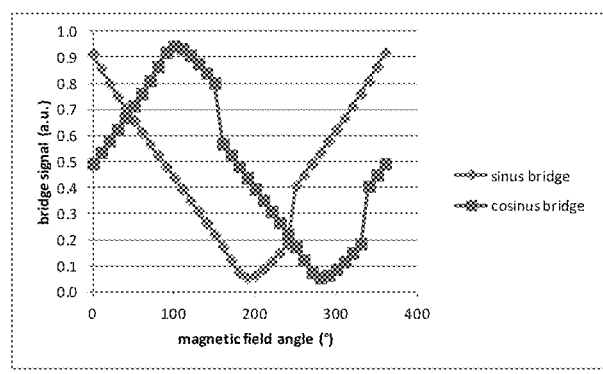
FIG. 4B is a plot of angle-dependent bridge output versus magnetic field angle according to an embodiment.
Figure 4C:
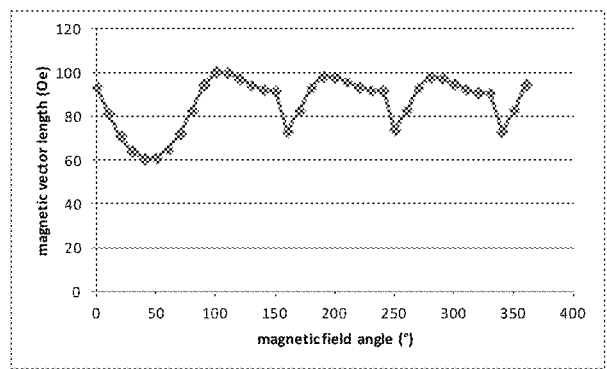
FIG. 4C is a plot of calculated vector length of FIGS. 4A and 4B versus magnetic field angle according to an embodiment.

Referring again to FIG. 2, a configuration of circuit 100 for the former approach, field strength estimation, is depicted. At low magnetic fields, the magnetization along the so-called hard axis, or axis of hard magnetization, being in embodiments perpendicular to the stripe length axis, remains unsaturated due to the shape anisotropy effect. Refer, for example, to FIG. 4A, which depicts the minor loop characteristic for a GMR or other xMR stripe with a width of 0.6 μm. The minor loop characteristic can be obtained by varying the external field along the hard magnetization axis. In this case, and referring to FIG. 4C, an estimation of the in-plane field strength can be done by calculating the vector length according to the following:

Sqrt(Vsin_narrow^2+Vcos_narrow^2)

Figure 4D:
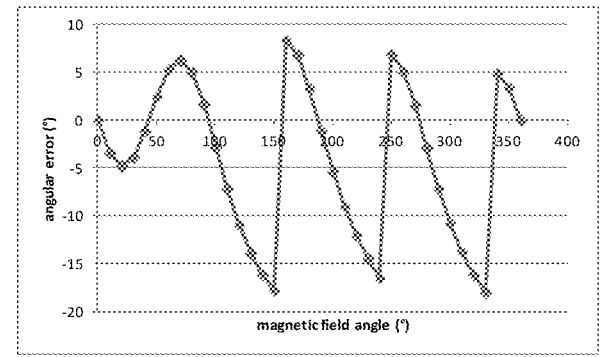
FIG. 4D is a plot of angle error of FIG. 4B versus magnetic field angle according to an embodiment.
Figure 4E:
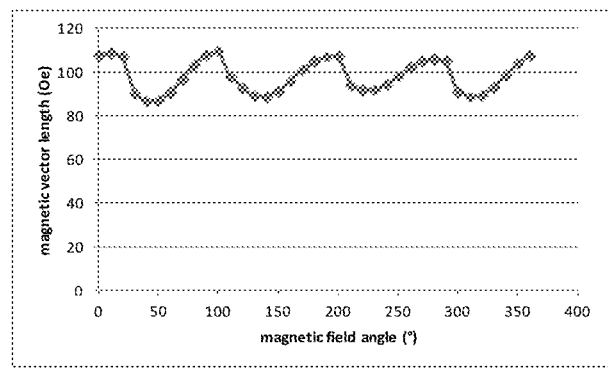
FIG. 4E is a plot of calculated vector length versus magnetic field angle according to an embodiment.

Here, Vsin_narrow is the voltage tapped between the two half-bridges of the bridge sensitive to the y-direction, and Vcos_narrow is the voltage tapped between the two half-bridges of the bridge sensitive to the x-direction. If the vector length, averaged over a full rotation, under-runs a certain limit, such as 10 mT, an alarm can be set by circuit 100. At the same time, the difference between the measured angle of circuitry 102 and circuitry 104 is very high, as shown in FIG. 4D; in the example case of Brot=10 mT, a difference of up to about 18 degrees is expected according to exemplary numerical simulations. The xMR sensor element configuration of circuitry 104 therefore acts as an under-field detector which can be used in magnetic field sensing system circuitry to determine whether the magnetic field sensing system operates in a first state which is a state corresponding to the external magnetic field being below a predetermined minimum threshold. The magnetic field sensing system can then include additional internal or external circuitry 135 (FIGS. 6 and 7) to determine that the situation is present. The additional circuitry 135 can receive an output signal of the xMR sensor arrangement (from 122, 123 in FIGS. 6 and 7) to determine, based on this signal, whether the magnetic sensor is operating in the first operation state. If so, the additional circuitry 135 can output, to a logic circuit or processor, an alarm signal based on the determining of the operation in the first state to indicate the dangerous or error condition. The logic or processor can in some embodiments start to act in response to the alarm signal for example to avoid possible dangerous or hazard situations.

Figure 4F:
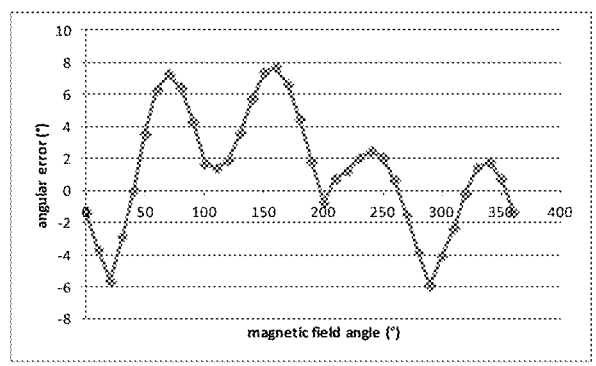
FIG. 4F is a plot of resulting angle error versus magnetic field angle according to an embodiment.
Figure 5:
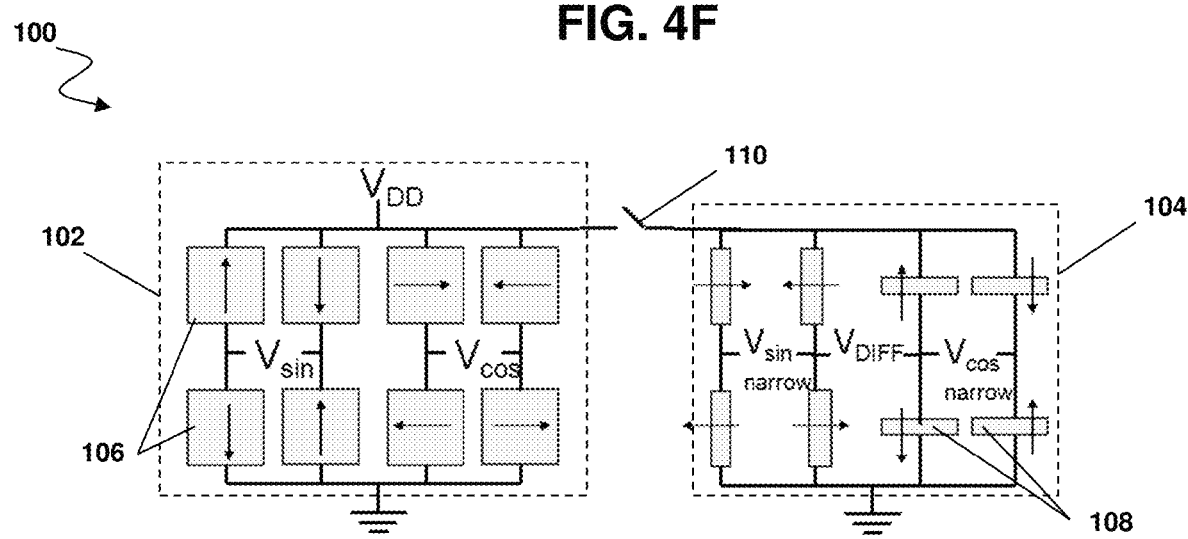
FIG. 5 is a xMR sensor circuit diagram according to an embodiment.

For further discrimination of the magnetic field strength, the difference of the measured magnetic field angle of the angle sensing circuitry 102 and field strength sensing circuitry 104 can be evaluated. When a rotating field strength of about 30 mT is used, a maximum angle difference of about 8 degrees is depicted (refer to FIG. 4F), which is about half for the example in which the magnetic field is 10 mT. This difference decreases further with increasing magnetic field strength. Turning to the second approach and referring to FIG. 5, at higher magnetic fields which exceed the linear range of the minor loop, the vector length is generally suitable only to determine the presence of a minimum magnetic field. To do this, $V_{DIFF}$ can be monitored. $V_{DIFF}$ is, in one example embodiment, the voltage difference between the voltage signal tapped from one half-bridge of the first bridge of circuitry 104 and one half-bridge from the second bridge of circuitry 104. When $V_{DIFF}$ is substantially 0 and either Vsin_narrow or Vcos_narrow are substantially 0, then the magnetic field can be determined to be too low or totally absent, for example, because the magnet generating the magnetic field has been removed or is broken. While one embodiment for tapping and combining signals to obtain $V_{DIFF}$ is described, other combinations of signals tapped from the first and second bridge can be used and combined in different ways to determine the presence of a minimum magnetic field.

Figure 6:
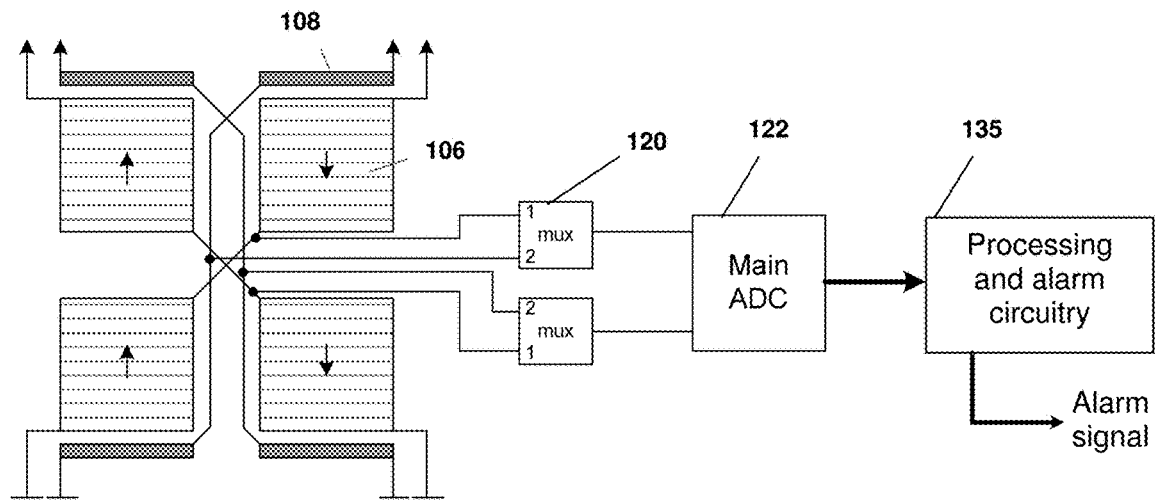
FIG. 6 is a xMR sensor circuit diagram according to an embodiment.
Figure 7:
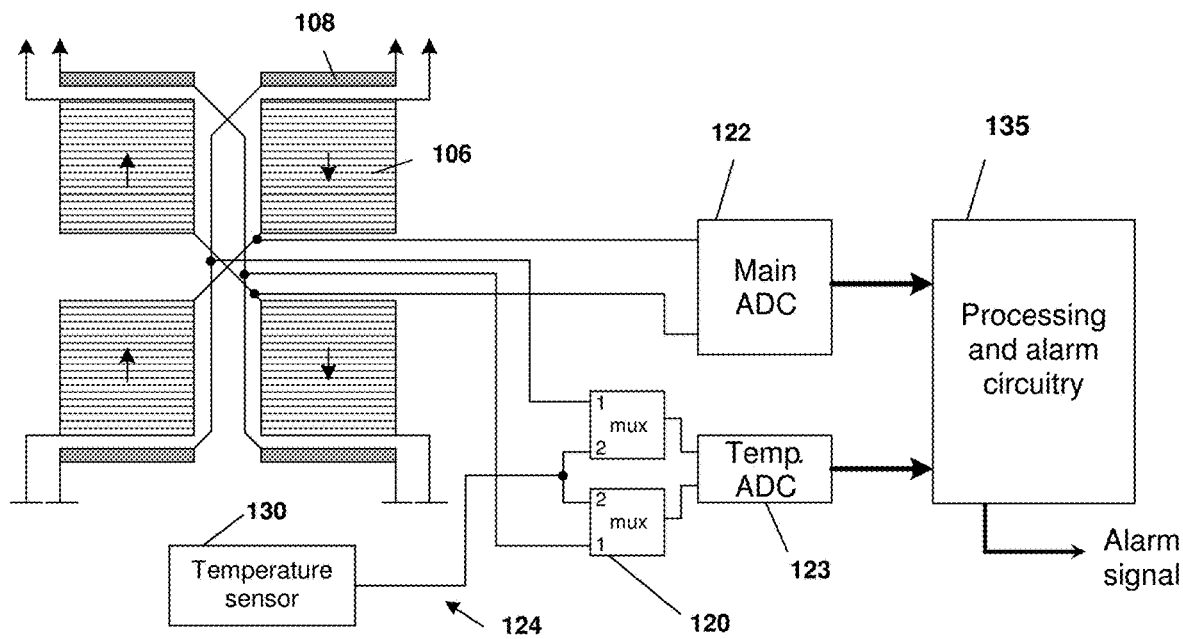
FIG. 7 is a xMR sensor circuit diagram according to an embodiment.

Given the dual circuitries 102 and 104, multiplexing can also be implemented in embodiments to provide signal path redundancy on-chip. This can be desired, for example, in some safety critical applications. Referring to FIG. 6, multiplexers 120 and an analog-to-digital converter (ADC) 122 can be coupled to circuitries 102 and 104 to use the same signal path for both circuitry 102 and circuitry 104. The ADC 122 can be coupled to additional internal or external (processing and alarm) circuitry 135, and the output of the ADC 122 can be provided to the circuitry 135. The circuitry 135 can be configured to determine, based on the output signal of the ADC 122, whether the magnetic sensor is operating in the first operation state (the external magnetic field being below a predetermined minimum threshold). The circuitry 135 can compare the output signal corresponding to the external magnetic field to a minimum magnitude threshold to determine the operating state. Based on this determination, the circuitry 135 can generate and output (e.g. to a logic circuit or processor) an alarm signal. For example, if the circuitry 135 determines that magnetic sensor is operating in the first state, the circuitry 135 can generate the alarm signal to indicate a possible dangerous or error condition. Referring to FIG. 7, angle and field strength sensor 100 can include a temperature sensor 130 according to an exemplary embodiment. In an exemplary embodiment, the temperature sensor 130 is configured to sense temperature of the angle and field strength sensor 100 and generate a temperature signal 124 based on the sensed temperature. The temperature signal 124 can be provided to temperature ADC 123 via multiplexers 120 to allow circuitry 104 and the temperature signal 124 to use the same signal path. In this example, the output of circuitry 102 is provided to ADC 122 so that the angle and field strength sensor 100 generates two output signals—output signal from ADC 122 and output signal from temperature ADC 123. The ADC 123 can also be coupled to the additional internal or external (processing and alarm) circuitry 135, and the output (temperature signal 124) of the ADC 123 can be provided to the circuitry 135. The circuitry 135 can be configured to determine, based on the output signal of the ADC 122 and the temperature signal 124, whether the magnetic sensor is operating in the first operation state (the external magnetic field being below a predetermined minimum threshold). Based on this determination, the circuitry 135 can generate and output (e.g. to a logic circuit or processor) an alarm signal.

Embodiments thereby provide specially shaped xMR structures sensitive to field amplitude integrated with xMR structures for angle sensing. The field amplitude portion can be used to sense the presence a minimum magnetic field or to estimate a field strength in embodiments, while the angle sensing portion can sense the field direction. In embodiments, the field strength sensing portion can be produced in the same production step as the angle sensing portion and also magnetized, such as using a high-temperature anneal, in the same process step as the angle sensing portion. Also in embodiments, the same signal path can be used for the angle sensing portion to provide complete redundancy.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

The invention claimed is:

1. A method comprising:
   providing a first magnetoresistive sensor in a sensor package;
   providing a second magnetoresistive sensor in the sensor package;
   sensing at least one characteristic of a magnetic field by the first magnetoresistive sensor;
   determining whether a magnitude of the sensed magnetic field meets a minimum magnitude threshold by sensing the magnitude of the magnetic field by the second magnetoresistive sensor; and
   generating an alert signal based on the determination of whether the magnitude of the sensed magnetic field meets the minimum magnitude threshold.

2. The method of claim 1, further comprising qualifying the sensed at least one characteristic of the magnetic field based on the determination.

3. The method of claim 1, wherein providing the first magnetoresistive sensor comprises providing at least one of a giant magnetoresistive (GMR) sensor, a tunneling magnetoresistive (TMR) sensor or an anisotropic magnetoresistive sensor (AMR).

4. The method of claim 1, wherein providing the second magnetoresistive sensor comprises providing at least one of a giant magnetoresistive (GMR) sensor, a tunneling magnetoresistive (TMR) sensor or an anisotropic magnetoresistive sensor (AMR).

5. The method of claim 1, wherein the first magnetoresistive sensor is a magnetic field angle sensing circuit and the second magnetoresistive sensor is a magnetic field magnitude sensing circuit.

6. The method of claim 1, wherein the alert signal is generated if the magnetic field sensed does not meet the minimum magnitude threshold.

7. The method of claim 1, wherein sensing at least one characteristic of the magnetic field comprises sensing an angle or rotation of the magnetic field.

8. The method of claim 1, wherein providing the first and the second magnetoresistive sensors comprises magnetizing respective magnetization references of the first and the second magnetoresistive sensors in a same production step.

9. The method of claim 1, wherein providing the first and the second magnetoresistive sensors comprises magnetizing the first and the second magnetoresistive sensors by a high-temperature anneal process.

10. The method of claim 1, further comprising determining an accuracy of the sensed at least one characteristic of the magnetic field based on the determined magnitude of the magnetic field.

11. The method of claim 10, wherein the accuracy of the sensed at least one characteristic of the magnetic field is determined based on a comparison of the determined magnitude of the magnetic field and the minimum magnitude threshold.

12. The method of claim 1, wherein the first and the second magnetoresistive sensors each comprise a Wheatstone bridge configuration.

13. The method of claim 1, further comprising:
coupling the second magnetoresistive sensor to a first input of a multiplexer;
coupling a temperature sensor to a second input of the multiplexer; and
coupling an output of the multiplexer to an analog-to-digital converter (ADC).

14. The method of claim 13, further comprising coupling the first magnetoresistive sensor to a second ADC.

15. The method of claim 1, further comprising:
coupling the first magnetoresistive sensor to a first multiplexer;
coupling the second magnetoresistive sensor to a second multiplexer; and
coupling respective outputs of the first and the second multiplexers to an analog-to-digital converter (ADC).

16. The method of claim 1, wherein the second magnetoresistive sensor is sensitive to lower magnetic field strengths than the first magnetoresistive sensor.

17. The method of claim 16, wherein the first magnetoresistive sensor is a magnetic field angle sensing circuit configured to sense an angle or rotation of the magnetic field, and the second magnetoresistive sensor is a magnetic field magnitude sensing circuit configured to sense the magnitude of the magnetic field.

18. A method comprising:
sensing an angle or rotation of a magnetic field by a first magnetoresistive sensor;
sensing a magnitude of the magnetic field by a second magnetoresistive sensor;
verifying the sensed angle or rotation of the magnetic field based the magnitude of the sensed magnetic field; and
generating an alarm signal based on the verification of the sensed angle or rotation of the magnetic field.

19. The method of claim 18, wherein the first magnetoresistive sensor is sensitive to lower magnetic field strengths than the second magnetoresistive sensor.

20. The method of claim 18, wherein the sensed angle or rotation of the magnetic field is verified based on a comparison of the magnitude of the sensed magnetic field and a threshold value.

21. The method of claim 18, wherein the alarm signal is generated if the sensed angle or rotation of the magnetic field fails verification.

* * * * *